US012740346B2

(12) United States Patent
Barbosa Lima et al.

(10) Patent No.: US 12,740,346 B2
(45) **Date of Patent: *Sep. 15, 2026**

(54) SYSTEMS FOR SELECTIVE DEPOSITION USING A SACRIFICIAL CAPPING LAYER

(71) Applicant: ASM IP Holding B.V., Almere (NL)

(72) Inventors: Lucas Petersen Barbosa Lima, Heverlee (BE); Rami Khazaka, Leuven (BE); Qi Xie, Wilsele (BE)

(73) Assignee: ASM IP Holding B.V., Almere (NL)

(*) Notice: Subject to any disclaimer, the term of this patent is extended or adjusted under 35 U.S.C. 154(b) by 816 days.

This patent is subject to a terminal disclaimer.

(21) Appl. No.: 17/960,203

(22) Filed: Oct. 5, 2022

(65) Prior Publication Data

US 2023/0026413 A1 Jan. 26, 2023

Related U.S. Application Data

(62) Division of application No. 16/998,220, filed on Aug. 20, 2020, now Pat. No. 11,495,459.

(Continued)

(51) Int. Cl.

| | |
|---|---|
| ***H10P 72/00*** | (2026.01) |
| ***C23C 16/30*** | (2006.01) |
| ***C23C 16/455*** | (2006.01) |
| ***C23C 16/52*** | (2006.01) |
| ***C23C 16/56*** | (2006.01) |

(Continued)

(52) U.S. Cl.

CPC .......... *H10P 14/3411* (2026.01); *C23C 16/30* (2013.01); *C23C 16/45561* (2013.01); *C23C 16/52* (2013.01); *C23C 16/56* (2013.01); *H10D 62/834* (2025.01); *H10P 14/2905* (2026.01); *H10P 14/3444* (2026.01); *H10P 14/6548* (2026.01); *H10P 50/282* (2026.01); *H10P 72/0421* (2026.01); *H10P 72/0451* (2026.01)

(58) Field of Classification Search

None

See application file for complete search history.

(56) References Cited

U.S. PATENT DOCUMENTS

| | | | |
|---|---|---|---|
| 6,333,235 | B1 | 12/2001 | Lee et al. |
| 11,594,600 | B2 | 2/2023 | Barbosa Lima |

(Continued)

OTHER PUBLICATIONS

P. Pichler, Intrinsic point defects, impurities and their diffusion in silicon, Springer-Verlag Wien, 2004.

(Continued)

*Primary Examiner* — Karla A Moore

(74) *Attorney, Agent, or Firm* — Snell & Wilmer L.L.P.

(57) ABSTRACT

Methods and systems for selectively depositing a p-type doped silicon germanium layer and structures and devices including a p-type doped silicon germanium layer are disclosed. An exemplary method includes providing a substrate, comprising a surface comprising a first area comprising a first material and a second area comprising a second material, within a reaction chamber; depositing a p-type doped silicon germanium layer overlying the surface, the p-type doped silicon germanium layer comprising gallium; and depositing a cap layer overlying the p-type doped silicon germanium layer. The method can further include an etch step to remove the cap layer and the p-type doped silicon germanium layer overlying the second material.

20 Claims, 9 Drawing Sheets

Related U.S. Application Data

(60) Provisional application No. 62/895,819, filed on Sep. 4, 2019.

(51) Int. Cl.

| | |
|---|---|
| ***H10D 62/834*** | (2025.01) |
| ***H10P 14/20*** | (2026.01) |
| ***H10P 14/60*** | (2026.01) |
| ***H10P 50/28*** | (2026.01) |

(56) References Cited

U.S. PATENT DOCUMENTS

| | | | | |
|---|---|---|---|---|
| 12,266,695 | B2 * | 4/2025 | Barbosa Lima | H10D 62/834 |
| 2004/0048439 | A1 * | 3/2004 | Soman | H10D 10/021<br>438/309 |
| 2008/0026149 | A1 * | 1/2008 | Tomasini | C23C 16/24<br>118/728 |
| 2008/0182397 | A1 | 7/2008 | Lam et al. | |
| 2010/0255658 | A1 * | 10/2010 | Aggarwal | C23C 16/45504<br>118/728 |
| 2011/0287600 | A1 | 11/2011 | Cheng et al. | |
| 2012/0024223 | A1 * | 2/2012 | Torres, Jr. | H01L 21/02529<br>118/728 |
| 2012/0153387 | A1 * | 6/2012 | Murthy | H10D 30/6219<br>257/E21.409 |
| 2014/0175054 | A1 | 6/2014 | Carlson et al. | |
| 2018/0083104 | A1 * | 3/2018 | Huang | H01L 21/02656 |
| 2021/0118679 | A1 | 4/2021 | Barbosa Lima | |

OTHER PUBLICATIONS

Solid solubilities of aluminum and gallium in germanium, Trumbore et al. J. Phys. Chem. Solids, 11, 239, 1959.

* cited by examiner

SYSTEMS FOR SELECTIVE DEPOSITION USING A SACRIFICIAL CAPPING LAYER

CROSS-REFERENCE TO RELATED APPLICATIONS

This application is a divisional of, and claims priority to, U.S. patent application Ser. No. 16/998,220 filed Aug. 20, 2020 titled METHODS FOR SELECTIVE DEPOSITION USING A SACRIFICIAL CAPPING LAYER, which claims the benefit to U.S. Provisional Patent Application Ser. No. 62/895,819, filed on Sep. 4, 2019 and titled METHODS FOR SELECTIVE DEPOSITION USING A SACRIFICIAL CAPPING LAYER, the disclosures of which are hereby incorporated by reference in their entirety.

FIELD OF INVENTION

The present disclosure generally relates to methods and systems suitable for forming electronic devices. More particularly, the disclosure relates to methods and systems that can be used for selectively depositing a doped silicon germanium film on a surface of a substrate.

BACKGROUND OF THE DISCLOSURE

Because of their relatively high electron and/or hole mobility, high-mobility semiconductors, such as silicon germanium, may be desirable to use in the fabrication of electronic devices, such as semiconductor devices. Devices formed with high-mobility semiconductor materials may exhibit better performance, faster speeds, reduced power consumption, and have higher breakdown fields, compared to similar devices formed with lower-mobility semiconductor materials, such as silicon.

Monocrystalline silicon germanium ($Si_{1-x}Ge_x$) semiconductor materials may be deposited or grown using a variety of techniques. For example, gas-phase processes, including molecular beam epitaxy and chemical vapor deposition, may be used to epitaxially grow or deposit monocrystalline silicon germanium films on a substrate.

In some semiconductor device applications, the silicon germanium film may include one or more dopants to obtain a desired carrier concentration. For example, the silicon germanium film may include a p-type dopant, such as boron, to increase the carrier concentration of the material. While boron-doped silicon germanium films may work well in some applications, the contact resistance of the boron-doped silicon germanium films may be undesirably high, particularly for use as source/drain regions in field effect transistors (FET). Attempts to lower the contact resistance include the addition of another dopant and a high-temperature anneal process. Such techniques may be problematic because the use of the relatively high temperatures during the anneal process can lead to clustering of one or more of the dopants of the doped silicon germanium films.

In many applications, it may be desirable to selectively deposit the silicon germanium material on a first material relative to a second material. For example, it may be desirable to selectively deposit the silicon germanium material overlying semiconductor material relative to dielectric or insulating material. However, attempts to selectively deposit a p-type doped silicon germanium layer that has relatively low contact resistance have been challenging. Accordingly, improved methods and systems for selectively depositing layers of p-type doped silicon germanium with relatively low contact resistance are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to selective deposition methods, to structures and devices formed using such methods, and to apparatus for performing the methods and/or for forming the structure and/or devices. While the ways in which various embodiments of the present disclosure address drawbacks of prior methods and systems are discussed in more detail below, in general, various embodiments of the disclosure provide improved methods of selectively depositing a p-type doped silicon germanium layer. The p-type doped silicon germanium layer can exhibit relatively low contact resistance. Additionally or alternatively, the p-type doped silicon germanium layer can be formed at relatively low temperatures—e.g., 350° C. to 600° C., without the use of a step of annealing the p-type doped silicon germanium layer to improve the contact resistance of the p-type doped silicon germanium layer.

In accordance with exemplary embodiments of the disclosure, a selective deposition method is disclosed. The selective deposition method includes providing a substrate within a reaction chamber, depositing a p-type doped silicon germanium layer overlying a surface of the substrate, and depositing a cap layer overlying the p-type doped silicon germanium layer. The surface of the substrate can include a first area comprising a first material and a second area comprising a second material. The p-type doped silicon germanium layer can include gallium. The incorporation of gallium in the p-type doped silicon germanium layer can reduce contact resistance of the p-type doped silicon germanium layer comprising gallium. As discussed in more detail below, use of the cap layer facilitates selective deposition of the p-type doped silicon germanium layer comprising gallium over the first material relative to the deposition of the p-type doped silicon germanium layer comprising gallium over the second material. Exemplary methods further include a step of etching the cap layer and the p-type doped silicon germanium layer overlying the second material. The etching can be performed using a halide-containing gas, such as hydrogen chloride, chlorine or the like. The first material can include, for example, semiconductor material, such as silicon, silicon germanium, germanium tin, silicon germanium tin, germanium, or the like. The second material can include, for example, a dielectric material, such as an oxide, a nitride, an oxynitride and/or the like, such as silicon nitride, silicon oxide ($SiO_2$), silicon carbide and mixtures thereof, such as SiOC, SiOCN, SiON. As set forth in more detail below, various steps of exemplary methods described herein can be performed in the same reaction chamber or in different reaction chambers of the same cluster tool.

In accordance with further exemplary embodiments of the disclosure, a structure is formed using a method as described herein. The structure can include a substrate and a p-type doped silicon germanium layer. The p-type doped silicon germanium layer can include about $1\times10^{17}$ at/cm$^3$ to about $5\times10^{21}$ at/cm$^3$, or about $1\times10^{17}$ at/cm$^3$ to about $3\times10^{21}$ at/cm$^3$, or about $1\times10^{18}$ at/cm$^3$ to about $2\times10^{21}$ at/cm$^3$, or about $8\times10^{18}$ at/cm$^3$ to about $1\times10^{21}$ at/cm$^3$, or greater than $1\times10^{19}$ at/cm$^3$ boron. Additionally or alternatively, the p-type doped silicon germanium layer can include about $1\times10^{12}$ at/cm$^3$ to about $5\times10^{21}$ at/cm$^3$, or $1\times10^{12}$ at/cm$^3$ to about $3\times10^{21}$ at/cm$^3$, or about $1\times10^{12}$ at/cm$^3$ to about $1\times10^{21}$ at/cm$^3$, or about $1\times10^{18}$ at/cm$^3$ to about $8\times10^{20}$ at/cm$^3$, or about $1\times10^{19}$ at/cm$^3$ to about $1\times10^{20}$ at/cm$^3$ gallium. Additionally or alternatively, the p-type doped silicon germanium layer can include about 30% to about 90%, or about 35% to about 70%, or about 40% to about 50% silicon and/or about 10% to about 70%, or about 65% to about 30%, or about 60% to about 50% germanium. A thickness of the p-type doped silicon germanium layer can be between about 1 nm and about 20 nm, between about 5 nm and 15 nm, or between about 7 nm and 10 nm. The structure can also include a cap layer. The cap layer can comprise silicon, such as p-type (e.g., boron) doped silicon. A concentration of the dopant in the silicon can be between 0 and about $1\times10^{21}$ at/cm$^3$, between about $8\times10^{18}$ at/cm$^3$ and about $5\times10^{20}$ at/cm$^3$, or between about $1\times10^{19}$ at/cm$^3$ and about $9\times10^{19}$ at/cm$^3$. A thickness of the cap layer can be between about 1 nm and about 10 nm, between about 2 nm and about 8 nm, or between about 4 nm and about 6 nm.

In accordance with yet additional embodiments of the disclosure, a device or portion thereof can be formed using a method as described herein. The device can include a substrate, a p-type doped silicon germanium layer, and a conducting layer overlying the p-type doped silicon germanium layer. The p-type doped silicon germanium layer can be used to form a source or drain region of the device, such as a field effect transistor (FET) (e.g., a FinFET).

In accordance with yet additional examples of the disclosure, a system to perform a method as described herein and/or to form a structure, device, or portion of either, is disclosed.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
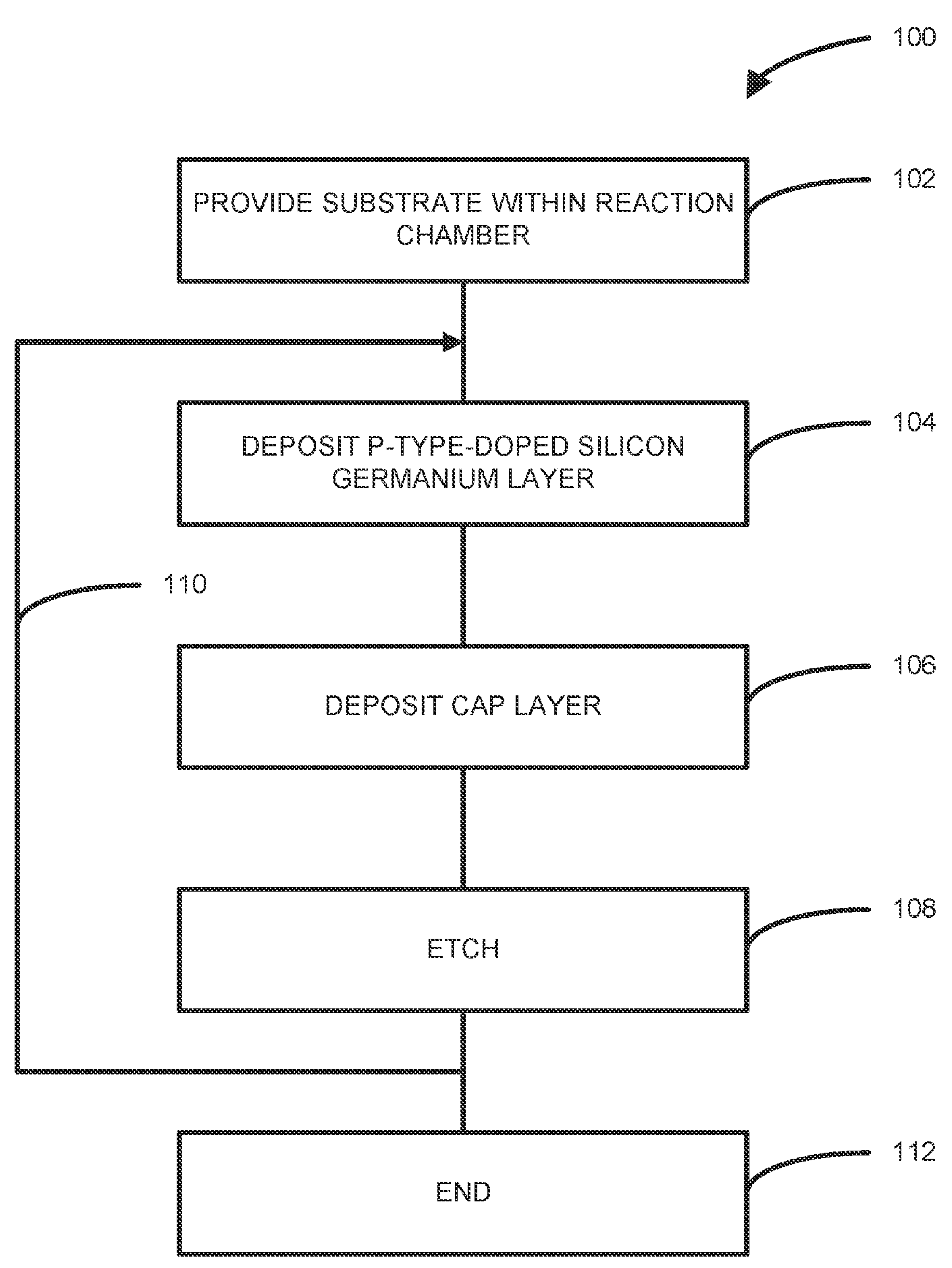
FIG. 1 illustrates a method in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

As set forth in more detail below, various embodiments of the disclosure provide methods for selectively depositing a p-type doped silicon germanium layer including gallium. Exemplary methods can be used to, for example, form source or drain regions of semiconductor devices that exhibit relatively low contact resistance and that maintain the structure and composition of the p-type doped silicon germanium layer including gallium.

Typical solutions to deposit p-type doped silicon germanium layers with relatively low contact resistance include growing silicon germanium layers with relatively high concentrations of boron (e.g., higher than $1\times10^{20}$ at/cm$^3$). However, high concentrations of boron in the silicon germanium films can be difficult to achieve, particularly for silicon germanium films having a relatively high (e.g., greater than 40%) germanium concentration. This is thought to be due to the low solubility of boron in germanium. Therefore, increasing the boron concentration in the silicon germanium layers alone may not be suitable to obtain the desired contact resistance.

To further decrease the contact resistance of the silicon germanium layers, gallium can be added to the p-type doped silicon germanium layers. Gallium has a higher solubility in germanium than does boron. Moreover, the heavier atomic mass of gallium, compared to boron, may be advantageous in the formation of shallow junctions by reducing the channeling effects, compared to films with only boron doping. And, materials at an interface of a film (e.g., between the p-type doped silicon germanium layer comprising gallium and an overlying conducting layer) can greatly affect the contact resistance of the film. Gallium is thought to reduce contact resistance in p-type doped silicon germanium layers that include gallium by reducing a barrier height with higher gallium concentration near the interface.

However, selective deposition of p-type doped silicon germanium layers including gallium has been challenging. Gallium tends to segregate to a surface of the p-type doped silicon germanium layers, and typical etchants used in selective deposition processes can react with the gallium at or near the surface to produce gallium byproducts, thereby reducing the gallium concentration in the p-type doped silicon germanium layers, particularly at or near the surface of the layers. The reduced gallium concentration generally leads to p-type doped silicon germanium layers having higher contact resistance.

Exemplary methods described herein use a cap layer during a selective deposition method to reduce an amount of gallium that would otherwise be lost from the p-type doped silicon germanium layer including gallium. The cap layer can act as a sacrificial layer that is removed during an etch step. Use of the cap layer can mitigate gallium segregation, and maintain desired gallium concentrations in the p-type doped silicon germanium layers, since the gallium solubility is higher in germanium (about $5\times10^{20}$ $cm^{-3}$) than in silicon (about $1\times10^{19}$ $cm^{-3}$). Thus, the p-type doped silicon germanium layer including gallium can remain substantially intact and maintain its original properties and characteristics.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor. The term "inert gas" can refer to a gas that does not take part in a chemical reaction and/or does not become a part of a film matrix to an appreciable extent. Exemplary inert gases include He, Ar, $N_2$, and any combination thereof.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or compound semiconductor materials, such as a Group II-VI or Group III-V semiconductor, and can include one or more layers overlying or underlying the bulk material. Further, the substrate can include various features, such as recesses, protrusions, and the like formed within or on at least a portion of a layer of the substrate. As set forth in more detail below, a surface of a substrate can include two of more areas, wherein each of the two or more areas comprise different material.

As used herein, the term "epitaxial layer" can refer to a substantially single crystalline layer upon an underlying substantially single crystalline substrate or layer.

As used herein, the term "chemical vapor deposition" can refer to any process wherein a substrate is exposed to one or more volatile precursors, which react and/or decompose on a substrate surface to produce a desired deposition.

As used herein, the term "silicon germanium" can refer to a semiconductor material comprising silicon and/or germanium and can be represented as $Si_{1-x}Ge_x$ wherein $1\geq x\geq 0$, or $0.2\geq x\geq 0.8$, or $0.4\geq x\geq 0.6$.

As used herein, the term "film" and/or "layer" can refer to any continuous or non-continuous structures and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

As used herein, a "structure" can include a substrate as described herein. Structures can include one or more layers overlying the substrate, such as one or more layers formed according to a method as described herein.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

Turning now to the figures, FIG. 1 illustrates a (e.g., selective deposition) method 100. FIGS. 2-5 illustrate structures 200, 300, 400, and 500 that can correspond to steps of method 100.

Method 100 includes the steps of providing a substrate within a reaction chamber (step 102), depositing a p-type doped silicon germanium layer (step 104), depositing a cap layer (step 106), etching (step 108), optionally repeating steps 104-108 (loop 110), and ending (step 112).

Figure 2:
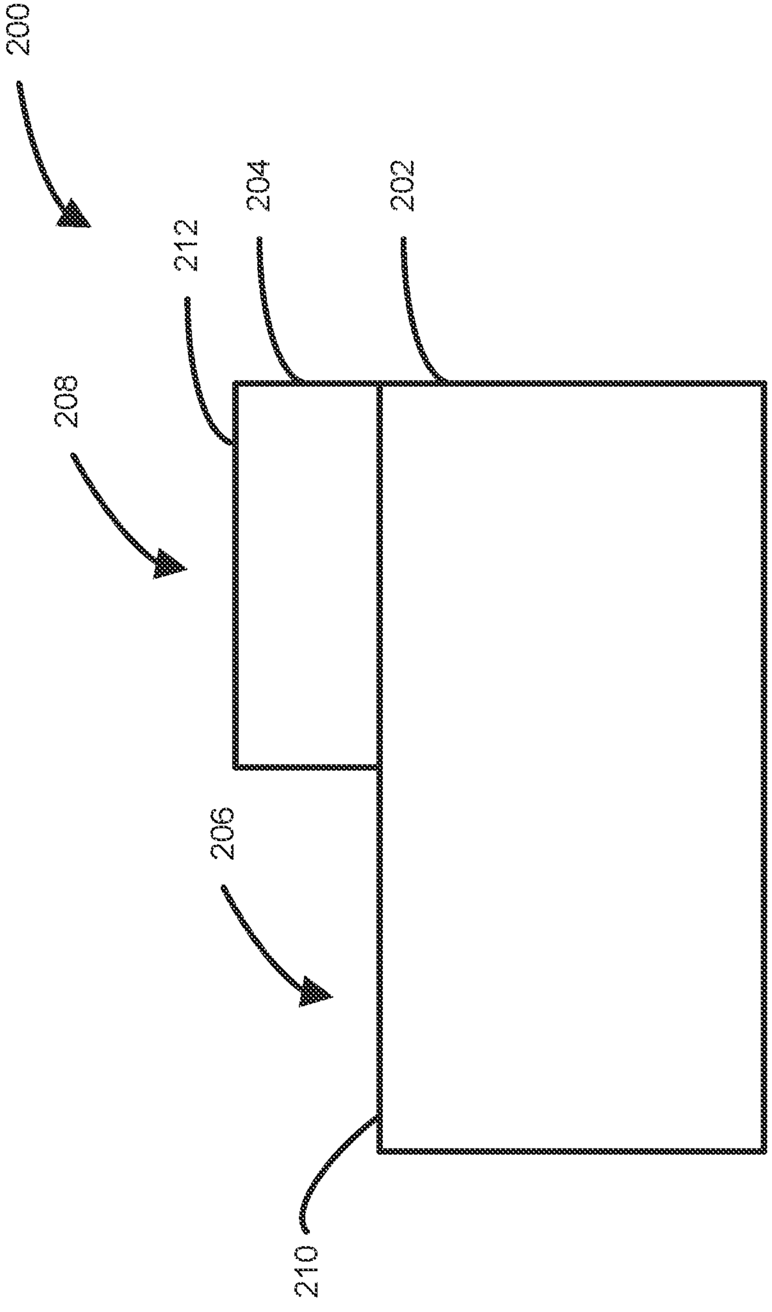
FIG. 2 illustrates a substrate for use in accordance with examples of the disclosure.

With reference to FIG. 2, a structure/substrate 200 can include a first area 206 comprising a first material and a second area 208 comprising a second material. The first material can include a monocrystalline surface 210; second area can include a non-monocrystalline surface 212, such as a polycrystalline surface or an amorphous surface. Monocrystalline surface 210 may comprise, for example, one or more of: silicon (Si), silicon germanium (SiGe), germanium tin (GeSn), silicon germanium tin (SiGeSn), or germanium (Ge). Non-monocrystalline surface 212 may include dielectric materials, such as oxides, oxynitrides, or nitrides, including, for example, silicon oxides, silicon nitrides, and silicon oxynitrides. In the illustrated example, substrate/structure 200 includes a monocrystalline layer of bulk material 202 and non-monocrystalline material (e.g., polycrystalline or amorphous material) 204, such as dielectric or insulating material.

As a non-limiting example, the reaction chamber may comprise a reaction chamber of a chemical vapor deposition system. However, it is also contemplated that other reaction chambers and alternative chemical vapor deposition systems may also be utilized to perform the embodiments of the present disclosure. The reaction chamber can be a stand-alone reaction chamber or part of a cluster tool.

Step 102 can include heating the substrate to a desired deposition temperature within the reaction chamber. In some embodiments of the disclosure, step 102 includes heating the substrate to a temperature of less than approximately 700° C., or to a temperature of less than approximately 650° C., or to a temperature of less than approximately 600° C., or to a temperature of less than approximately 550° C., or to a temperature of less than approximately 500° C., or to a temperature of less than approximately 450° C., or even to a temperature of less than approximately 400° C. For example, in some embodiments of the disclosure, heating the substrate to a deposition temperature may comprise heating the substrate to a temperature between approximately 400° C. and approximately 700° C.

In addition to controlling the temperature of the substrate, a pressure within the reaction chamber may also be regulated. For example, in some embodiments of the disclosure, the pressure within the reaction chamber during step 102 may be less than 200 Torr, or less than 100 Torr, or less than 50 Torr, or less than 25 Torr, or even less than 10 Torr. In some embodiments, the pressure in the reaction chamber may be between 10 Torr and 100 Torr.

During step 104, a layer of p-type doped silicon germanium including gallium is deposited on a layer overlying the surface of the substrate. The layer of p-type doped silicon germanium may form as a (e.g., mono) crystalline material overlying the first area/surface (e.g., area 206/surface 210) and as a polycrystalline or amorphous material over the second, non-monocrystalline area/surface (e.g., area 208/surface 212). A nucleation delay of the deposited layer of p-type doped silicon germanium may be greater on the second/non-monocrystalline surface 212 relative to the first surface 210.

Figure 3:
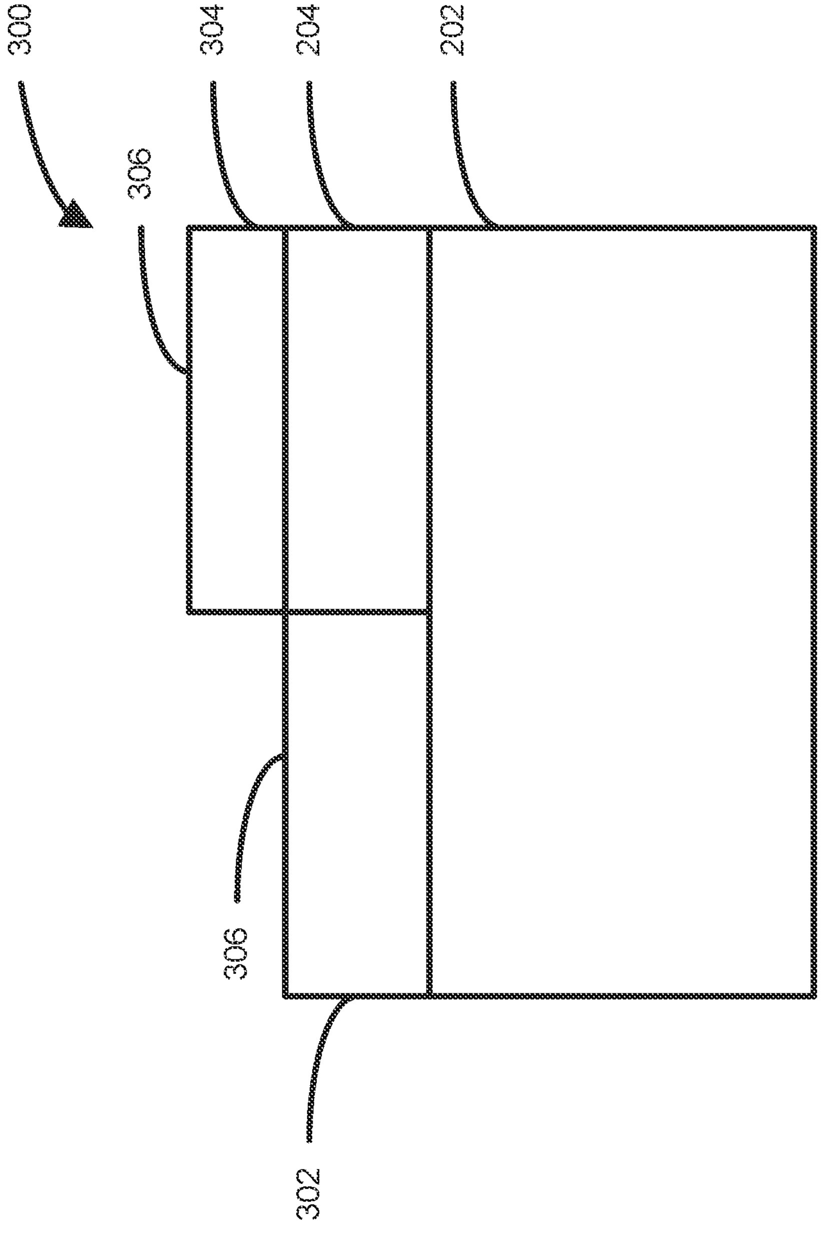
FIGS. 3-5 illustrate structures in accordance with exemplary embodiments of the disclosure.

FIG. 3 illustrates structure 300, including a p-type doped silicon germanium layer 306 including a first portion 302 formed over first area 206 and a second portion 304 formed over second area 208. First portion 302 can form as a monocrystalline layer overlying the first area/material and second portion 304 can form as a non-monocrystalline (e.g., polycrystalline or amorphous) layer overlying the second area/material.

During step 104, a silicon precursor, a germanium precursor, a p-type dopant (e.g., boron), and a gallium precursor are flowed into the reaction chamber—e.g., through one or more gas injectors, such as multi-port injectors (MPIs) including a plurality of individual port injectors for providing a gas mixture into the reaction chamber. Various combinations of the precursors can be supplied to one or more of the individual port injectors to fine tune concentration profiles as desired. To mitigate reaction with the gallium in the film as the film deposits, the silicon precursor, germanium precursor, p-type dopant, and/or gallium precursor (e.g., all the precursors) may desirably be halide (e.g., chlorine) free. In other words, a chemical formula of a precursor, or component thereof, may not include Cl.

The gallium dopant precursor can comprise, for example, at least one of trimethylgallium (TMG) or triethylgallium (TEG), tritertiarybutylgallium (TTBGa), galliumtrichlorine ($GaCl_3$), $Ga(BH_4)_3$, $RGaCl_2$, $GaR_3$, $GaH_x$, wherein R can be, for example, an ethyl, butyl, or propyl, group.

The silicon precursor may comprise one or more hydrogenated silicon precursors selected from the group comprising: silane ($SiH_4$), disilane ($Si_2H_6$), trisilane ($Si_3H_8$), or tetrasilane ($Si_4H_{10}$). The germanium precursor may comprise at least one of germane ($GeH_4$), digermane ($Ge_2H_6$), trigermane ($Ge_3H_8$), or germylsilane ($GeH_6Si$). The p-type (e.g., boron) dopant precursor can include, for example, at least one of diborane ($B_2H_6$) or deuterium-diborane ($B_2D_6$), or one or more borohydrides. Exemplary borohydrides include gallium borohydride ($Ga(BH_4)_3$), aluminum borohydride ($Al(BH_4)_3$), and indium borohydride ($In(BH_4)_3$). In alternative embodiments of the disclosure, the p-type dopant precursor may comprise a borohydride having the formula $Y_xM(BH_4)_{3-x}$, wherein Y is independently chosen from hydrogen, deuterium, chlorine, bromine, and iodine; M is a Group IIIA metal independently chosen from gallium, aluminum, and indium; and x is an integer from 0-2. In some embodiments of the disclosure, the p-type dopant precursor, e.g., the boron dopant precursor, may be replaced by an alternative p-type dopant precursor. For example, the p-type dopant precursor may comprise an aluminum (Al) containing dopant precursor, such as, for example, a borohydride (e.g., $Al(BH_4)_3$).

In some embodiments, the silicon precursor can be provided into the reaction chamber at a flow rate of less than 500 sccm, or less than 250 sccm, or even less than 50 sccm. For example, the silicon precursor may flow into the reaction chamber at a silicon precursor flow rate between approximately 1 sccm and approximately 500 sccm.

In some embodiments, the germanium precursor is provided into the reaction chamber at a flow rate of less than 1000 sccm, or less than 300 sccm, or even less than 10 sccm. For example, the germanium precursor may flow into the reaction chamber at a germanium precursor flow rate between approximately 1 sccm and approximately 1000 sccm. In some embodiments, the germanium precursor may be provided in diluted form and the diluted form may comprise approximately 5% germanium precursor, such as, $GeH_4$, for example, in a carrier gas.

In some embodiments, the p-type (e.g., boron) dopant precursor is provided into the reaction chamber at a flow rate of less than 500 sccm, or less than 250 sccm, or even less than 50 sccm. For example, the boron dopant precursor may flow into the reaction chamber at a boron dopant precursor flow rate between approximately 1 sccm and approximately 500 sccm. In some embodiments, the boron dopant precursor may be provided in diluted form and the diluted form may comprise approximately 1% p-type dopant precursor, such as diborane, for example, in a carrier gas.

In some embodiments, the gallium precursor is provided into the reaction chamber at a flow rate of less than 500 sccm, or less than 250 sccm, or even less than 50 sccm. For example, the gallium precursor may flow into the reaction chamber at a flow rate between approximately 1 sccm and approximately 500 sccm. In some embodiments, the gallium precursor may be provided in diluted form and the diluted form may comprise approximately 1% gallium precursor, such as, triethylgallium, for example, in a carrier gas.

A thickness of the p-type doped silicon germanium layer formed during step 104 in area 206 and/or area 208 can be between about 1 nm and about 20 nm, between about 5 nm and about 15 nm, or between about 7 nm and about 10 nm. A concentration of p-type dopant (e.g., boron) in the p-type doped silicon germanium layer in area 206 and/or area 208 can range from about $1\times10^{17}$ at/cm$^3$ to about $5\times10^{21}$ at/cm$^3$, or from about $1\times10^{17}$ at/cm$^3$ to about $3\times10^{21}$ at/cm$^3$, or about $1\times10^{18}$ at/cm$^3$ to about $2\times10^{21}$ at/cm$^3$, or about $8\times10^{18}$ at/cm$^3$ to about $1\times10^{21}$ at/cm$^3$ or greater than $1\times10^{19}$ at/cm$^3$ boron. The p-type doped silicon germanium layer in area 206 and/or area 208 can include about $1\times10^{17}$ at/cm$^3$ to about $5\times10^{21}$ at/cm$^3$, or about $1\times10^{17}$ at/cm$^3$ to about $3\times10^{21}$ at/cm$^3$, or about $1\times10^{17}$ at/cm$^3$ to about $1\times10^{21}$ at/cm$^3$, or about $1\times10^{18}$ at/cm$^3$ to about $8\times10^{20}$ at/cm$^3$, or about $1\times10^{19}$ at/cm$^3$ to about $1\times10^{20}$ at/cm$^3$ gallium. Additionally or alternatively, the p-type doped silicon germanium layer in area 206 and/or area 208 can include about 30% to about 90%, or about 35% to about 70%, or about 40% to about 50% silicon and/or about 10% to about 70%, or about 65% to about 30%, or about 60% to about 50% germanium. In some embodiments, the germanium (and/or other component) content within the p-type doped silicon germanium layer in area 206 and/or area 208 may not be constant, but rather may be varied, such that the germanium content (and/or other component) may have a graded composition within the p-type doped silicon germanium layer.

During step 106, a cap layer is formed overlying the p-type doped silicon germanium layer. The cap layer can comprise or consist essentially of silicon. In some cases, the cap layer can include doped silicon, such as a p-type (e.g., boron and/or gallium) doped silicon. A concentration of the p-type dopant in the silicon layer can be up to $5\times1\times10^{21}$ at/cm$^3$, or up to $3\times10^{21}$ at/cm$^3$, e.g., it can range from 0 and about $1\times10^{21}$ at/cm$^3$, between about $8\times10^{18}$ at/cm$^3$ and about $5\times10^{20}$ at/cm$^3$, or between about $1\times10^{19}$ at/cm$^3$ and about $9\times10^{19}$ at/cm$^3$.

In some embodiments, the cap layer comprises or essentially consists of a silicon germanium alloy. In other words, in some embodiments, the silicon germanium is For example, the cap layer may comprise 10 mol % silicon, or 20 mol % silicon, or 30 mol % silicon, or 40 mol % silicon, or 50 mol % silicon, or 60 mol % silicon, or 70 mol % silicon, or 80 mol % silicon, or 90 mol % silicon. For example, the cap layer may comprise 10 mol % germanium, or 20 mol % germanium, or 30 mol % germanium, or 40 mol % germanium, or 50 mol % germanium, or 60 mol % germanium, or 70 mol % germanium, or 80 mol % germanium, or 90 mol % germanium. In some embodiments, the silicon germanium-containing cap layer is doped with a p-type dopant, e.g., boron and/or gallium. A concentration of the p-type dopant in the silicon germanium cap layer can range from 0 and about $1\times10^{21}$ at/cm$^3$, between about $8\times10^{18}$ at/cm$^3$ and about $5\times10^{20}$ at/cm$^3$, or between about $1\times10^{19}$ at/cm$^3$ and about $9\times10^{19}$ at/cm$^3$.

In some embodiments, the cap layer is grown by means of precursors that do not contain a halogen. In some embodiments, the cap layer is grown by means of precursors that do not contain chlorine. The cap layer may be grown, for example, using one or more of the following precursors. As a silicon precursor, silane or disilane may be used. As a germanium precursor, germane or digermane may be used. As a boron precursor, diborane may be used. As a gallium precursor, triethylgallium may be used.

Figure 4:
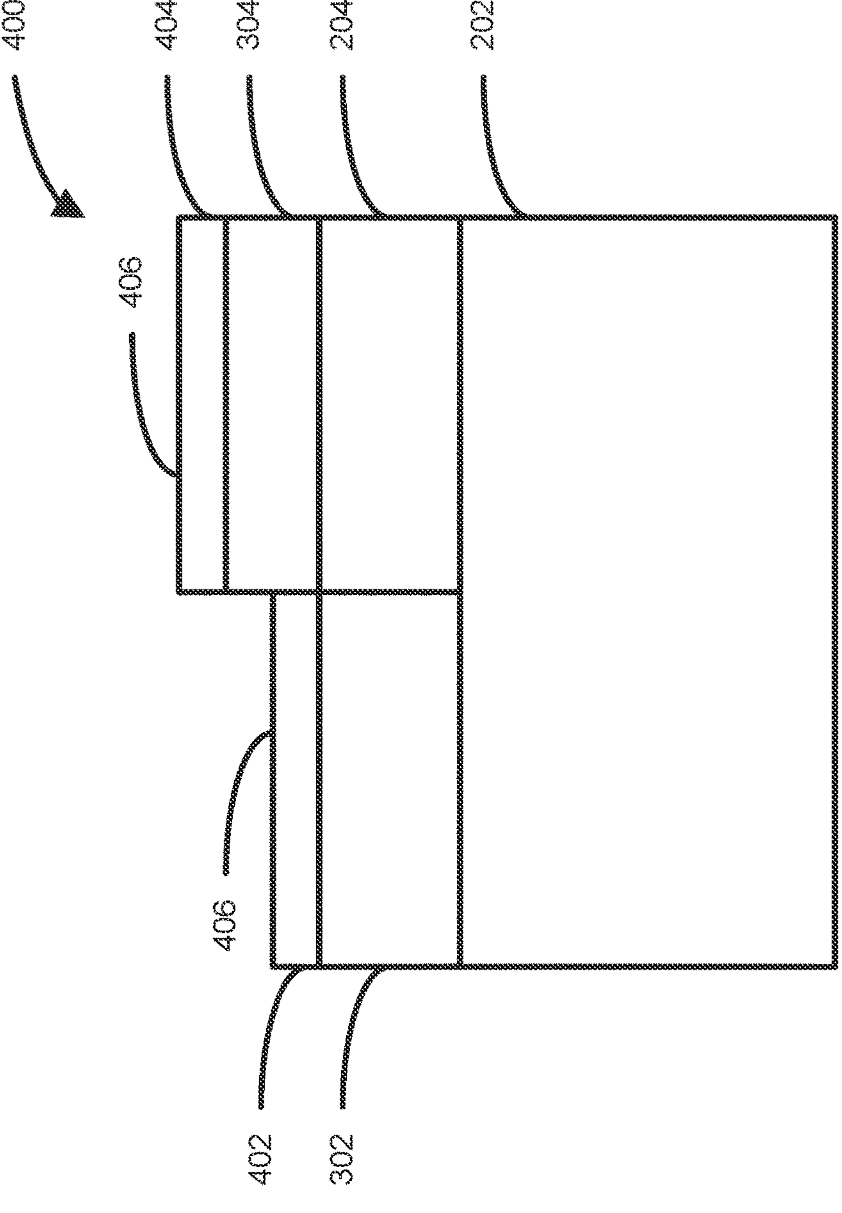

FIG. 4 illustrates structure 400, which includes a cap layer 406. Cap layer 406 can include a first portion 402 formed in first area 206 and a second portion 404 formed in second area 208. First portion 402 can be monocrystalline and second portion 404 can be non-monocrystalline—e.g., amorphous or polycrystalline. A nucleation delay of the cap layer may be greater in second area 208 relative to first area 206.

A thickness of cap layer 406 over area 206 and/or 208 formed during step 106 can be between about 1 nm and about 10 nm, between about 2 nm and about 8 nm, or between about 4 nm and about 6 nm. A concentration of p-type dopant (e.g., boron) in the p-type doped silicon germanium layer over area 206 and/or 208 can range from about $1\times10^{17}$ at/cm$^3$ to about $5\times10^{21}$ at/cm$^3$, or from about $1\times10^{17}$ at/cm$^3$ to about $3\times10^{21}$ at/cm$^3$, or about $1\times10^{18}$ at/cm$^3$ to about $2\times10^{21}$ at/cm$^3$, or about $8\times10^{18}$ at/cm$^3$ to about $1\times10^{21}$ at/cm$^3$ or greater than $1\times10^{19}$ at/cm$^3$ boron. Including a dopant, such as boron, in the cap layer may be desirable to increase an etch rate of cap layer 406 (portion 402 and/or portion 404) during step 108.

Returning to FIG. 1, step 106 can be performed in the same reaction chamber used during step 104. Alternatively, step 106 can be performed in another reaction chamber, such as another reaction chamber in the same cluster tool as the reaction chamber used during step 104.

The cap layer can be formed by flowing silicon and optionally a dopant precursor to a reaction chamber. The silicon precursor and the dopant precursor (e.g., p-type dopant precursor) can be the same or similar to those described above. Further, the flowrates of the precursors, the reaction chamber pressures, and/or the temperatures can be the same or similar to those described above in connection with step 104.

SIMS analysis of structures including a cap layer overlying a p-type doped silicon germanium layer including gallium showed no gallium segregation towards the cap layer.

During step 108, an etch is performed to at least partially remove the cap layer over the first area and remove the cap layer over the second area. Additionally, the p-type doped silicon germanium layer overlying the second area/material is removed, to thereby form a selectively deposited p-type doped silicon germanium layer overlying the first material/area relative to the second material/area.

A selective deposition process can involve a greater amount of material remaining on a first surface relative to a second surface. For example, the selective process may result in a greater amount of the p-type doped silicon germanium layer remaining in the first area formed over monocrystalline material relative to any p-type doped silicon germanium layer remaining in the second area over non-monocrystalline material. In some embodiments of the disclosure, the selectivity of the deposition process can be expressed as the ratio of material formed on the first surface (or in the first area) relative to the amount of material formed on the first and second surfaces (or areas) combined. For example, if 10 nm of p-type doped silicon germanium layer remains in the first area and 1 nm of the p-type doped silicon germanium layer remains in the second area, the selective deposition process will be considered to have 91% selectivity. In some embodiments, the selectivity of the methods disclosed herein may be above about 80%, above about 90%, above about 95%, 99.5%, 98%, 99%, or even about 100%. Additionally or alternatively, a ratio of the p-type doped silicon germanium layer remaining in the first area relative to p-type doped silicon germanium layer remaining in the second area can be greater than, for example, 10, 5, or 2.

The cap layer and/or the p-type doped silicon germanium layer over the second area may have a higher etch rate—e.g., due to the amorphous or polycrystalline structure, than the respective layers over the first area—which can include monocrystalline materials. Thus, the non-crystalline material can be easily removed, while maintaining portion 302 substantially intact. In some cases, a small portion of cap layer 406 can remain over portion 302 after one or more etch steps 108.

Step 108 can be performed in the same reaction chamber used during step 104 and/or step 106. Alternatively, step 108 can be performed in another reaction chamber, such as another reaction chamber of the same cluster tool.

In some embodiments, a halide gas is used as an etchant during step 108. The halide gas can include, for example, one or more of hydrogen chloride, chlorine, or the like. During step 108, the halide gas can be flowed into the reaction chamber at a flow rate of less than 500 sccm, or less than 250 sccm, or even less than 100 sccm. For example, the halide gas may flow into the reaction chamber at a halide gas flow rate between approximately 1 sccm and approximately 500 sccm.

As illustrated, steps 104-108 can be repeated (loop 110) as desired until a desired thickness of the p-type doped silicon germanium is formed overlying the first area/material on the substrate. For example, steps 104-108 can be repeated about 1 to about 500 times, about 2 to about 100 times, about 2 to about 50 times, about 2 to about 30 times, or about 2 to about 20 times. Further, one or more (e.g., each) of steps 104-108 can be repeated one or more times prior to proceeding to the next step. Once a desired layer thickness of the p-type doped silicon germanium layer is obtained, method 100 can end (step 112).

Methods described herein can enlarge a selectivity window of p-type doped silicon germanium layer deposition that might otherwise arise, for example, where the deposition has a longer nucleation delay on surface 212, compared to surface 210. A thickness of the cap layer 406 can thus be less in cases where the nucleation delay is greater for p-type doped silicon germanium layer deposition over surface 212, compared to surface 210.

Figure 5:
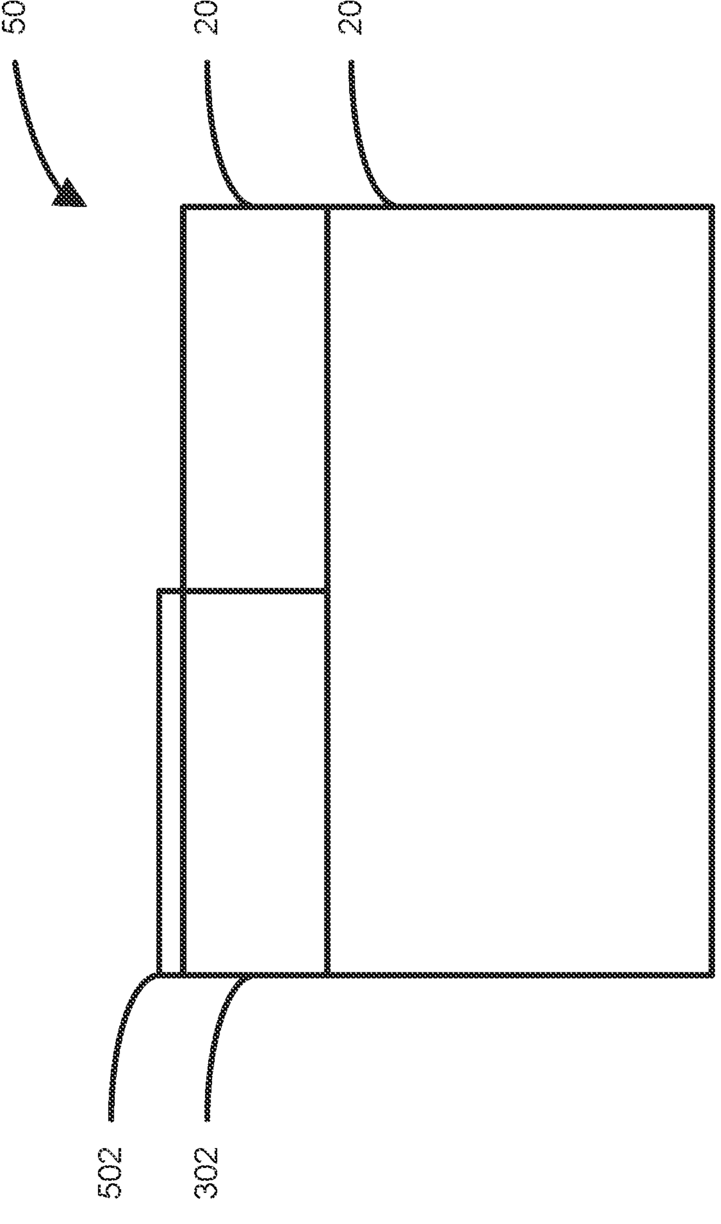

FIG. 5 illustrates structure 500 after the cap layer has been removed over second area 208 and the p-type doped silicon germanium layer has been removed in second area 208. As illustrated, a portion 502 of cap layer 406 can remain over first portion 302. Portion 502 may be relatively thin and might not be detrimental to the device performance, since this thin layer can be doped, and therefore minimal impact on the full device performance is expected. Alternatively, all of layer 406 can be removed from first area 206. First portion 302 of the p-type doped silicon germanium layer can include relatively high gallium concentrations levels, as set forth herein, which allows for relatively low resistance of the layer and relatively low contact resistance. For example, an electrical resistivity of the p-type doped silicon germanium layer in area 206 can be less than 0.8 mΩ·cm, or less than 0.6 mΩ·cm, or less than 0.4 mΩ·cm, or even less than 0.3 mΩ·cm. In some embodiments, the p-type doped silicon germanium layer has an electrical resistivity between approximately 0.3 mΩ·cm and approximately 0.8 mΩ·cm.

Figure 6:
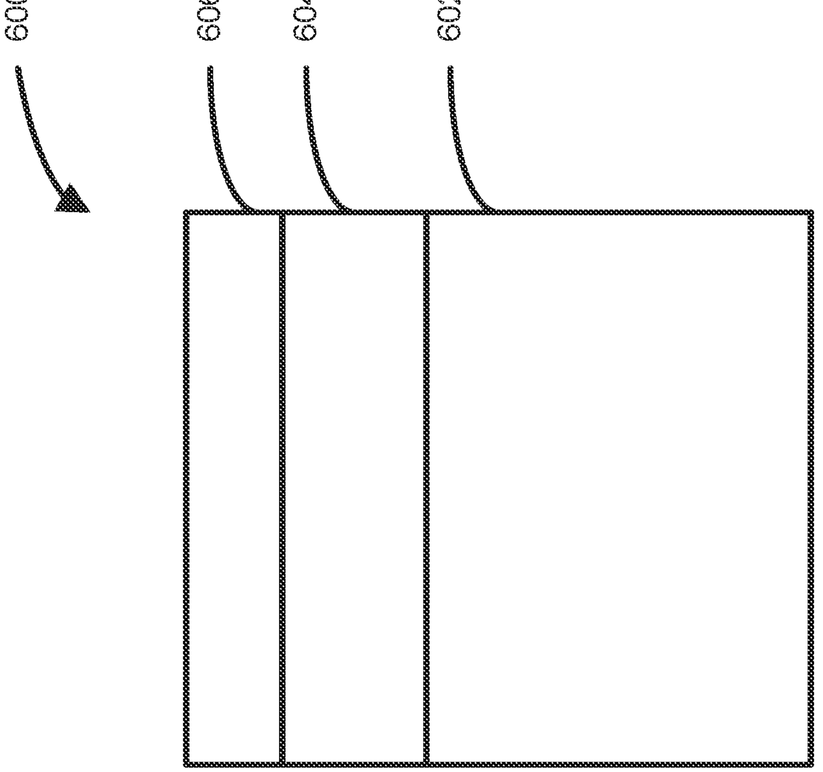
FIG. 6 illustrates a portion of a device in accordance with exemplary embodiments of the disclosure.

FIG. 6 illustrates a portion of a device 600 in accordance with additional examples of the disclosure. Portion of a device 600 includes a substrate 602, a p-type doped silicon germanium layer 604, and a conducting layer 606.

Substrate 602 can be or include any of the substrate material described herein. For example, substrate 602 can be the same as substrate 202 and/or structure 200.

P-type doped silicon germanium layer 604 can be the same or similar to first portion 302 of the p-type doped silicon germanium layer described above. P-type doped silicon germanium layer 604 can be used to form or be a source or drain region of a field effect transistor (FET), such as a source or drain region of a FinFET or other FET device.

Conducting layer 606 can include, for example, metal, such as titanium, nickel, cobalt, nickel platinum alloy, or the like. A contact resistance of p-type doped silicon germanium layer 604 can be lower than $10^{-9}$ Ω·cm$^2$ to about $5\times10^{-19}$ Ω·cm$^2$, about $5\times10^{-10}$ Ω·cm$^2$ to about $2\times10^{-19}$ Ω·cm$^2$, or about $2\times10^{-19}$ Ω·cm$^2$ to about $1\times10^{-19}$ Ω·cm$^2$ without annealing.

Figure 7:
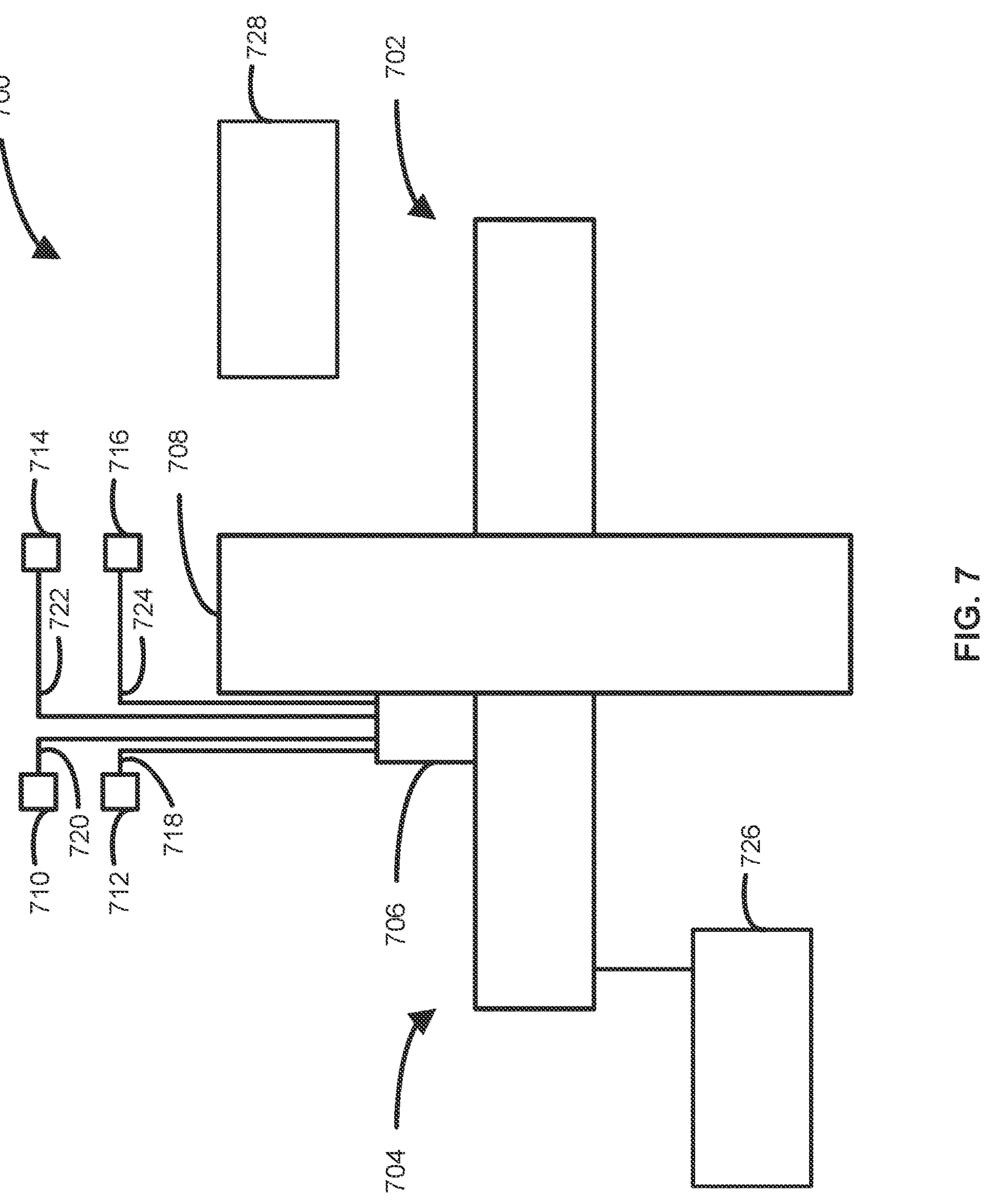
FIG. 7 illustrates a reactor system in accordance with additional exemplary embodiments of the disclosure.

FIG. 7 illustrates a system 700 in accordance with yet additional exemplary embodiments of the disclosure. System 700 can be used to perform a method as described herein and/or form a structure or device portion as described herein.

In the illustrated example, system 700 includes an optional substrate handling system 702, one or more reaction chambers 704, a gas injection system 706, and optionally a wall 708 disposed between reaction chamber(s) 704 and substrate handling system 702. System 700 can also include a first gas source 710, a second gas source 712, a third gas source 714, a fourth gas source 716, an exhaust source 726, and a controller 728.

Although illustrated with four gas sources 710-716, system 700 can include any suitable number of gas sources. Gas sources 710-716 can each include, for example, a precursor gas, such as a precursor (e.g., silicon precursor, germanium precursor, p-type dopant precursor, and/or gallium precursor) as described above, including mixtures of such precursors and/or mixtures of one or more precursors with a carrier gas, such as hydrogen, nitrogen, argon, helium or the like. Additionally or alternatively, one of gas sources 710-716 or another gas source can include an etchant, such as a halide—e.g., a chlorine-containing gas, such as hydrogen chloride and/or chlorine. Gas sources 710-716 can be coupled to reaction chamber 704 via lines 718-724, which can each include flow controllers, valves, heaters, and the like.

System 700 can include any suitable number of reaction chambers 704 and substrate handling systems 702. Further, one or more reaction chambers 704 can be or include a cross-flow, cold wall epitaxial reaction chamber.

Vacuum source 720 can include one or more vacuum pumps.

Controller 728 can be configured to perform various functions and/or steps as described herein. Controller 728 can include one or more microprocessors, memory elements, and/or switching elements to perform the various functions. Although illustrated as a single unit, controller 728 can alternatively comprise multiple devices. By way of examples, controller 728 can be used to control gas flow (e.g., by monitoring flow rates of precursors and/or other gases from sources 710-716 and/or controlling valves, motors, heaters, and the like). Further, when system 700 includes two or more reaction chambers, the two or more reaction chambers can be coupled to the same/shared controller.

During operation of reactor system 700, substrates, such as semiconductor wafers (not illustrated), are transferred from, e.g., substrate handling system 702, to reaction chamber 704. Once substrate(s) are transferred to reaction chamber 704, one or more gases from gas sources 710-716, such as precursors, dopants, carrier gases, and/or purge gases, are introduced into reaction chamber 704 via gas injection system 706. Gas injection system 706 can be used to meter and control gas flow of one or more gases (e.g., from one or more gas sources 710-716) during substrate processing and to provide desired flows of such gas(es) to multiple sites within reaction chamber 704.

Figure 8:
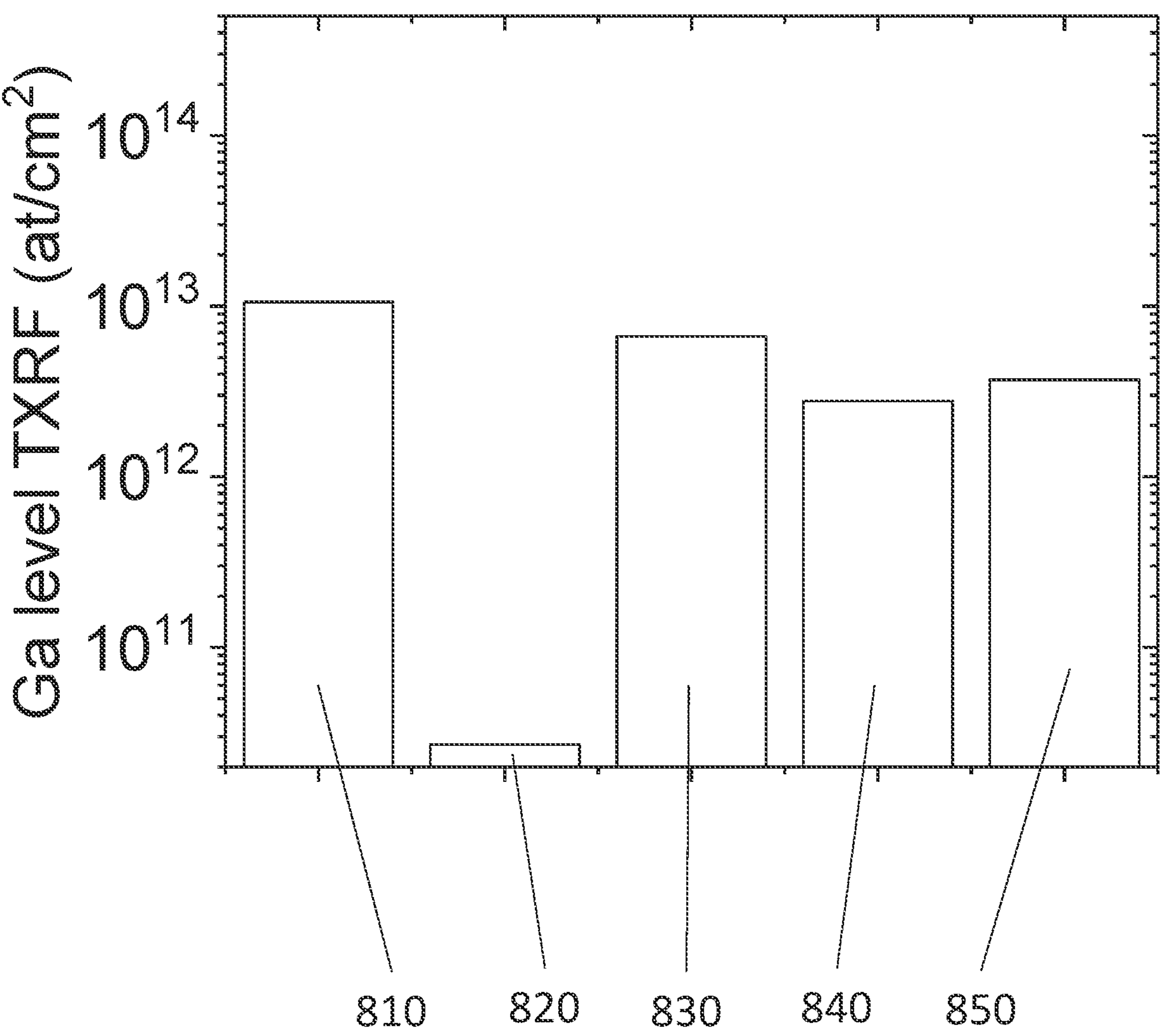
FIG. 8 shows total reflection transmission x-ray fluorescence (TXRF) data that demonstrate the efficacy of exemplary embodiments of the disclosure.

FIG. 8 shows total reflection transmission x-ray fluorescence (TXRF) data that demonstrate the efficacy of exemplary embodiments of the disclosure. In particular, a substrate comprising uncapped SiGe:B:Ga (810) loses much of its Ga after an HF dip (820). When the SiGe:B:Ga is capped with silicon, FIG. 8 (830,840,850) shows that the Ga surface concentration is maintained at a much higher level after an HF dip. In particular, data point 830 shows this for a SiGe:B:Ga layer capped with 3 nm of Si and exposed to an HF dip, data point 840 shows this for a SiGe:B:Ga layer capped with 3 nm boron-doped Si and exposed to an HF dip, and data point 850 shows this for a SiGe:B:Ga layer capped with 5 nm boron-doped Si and exposed to an HF dip.

Figure 9:
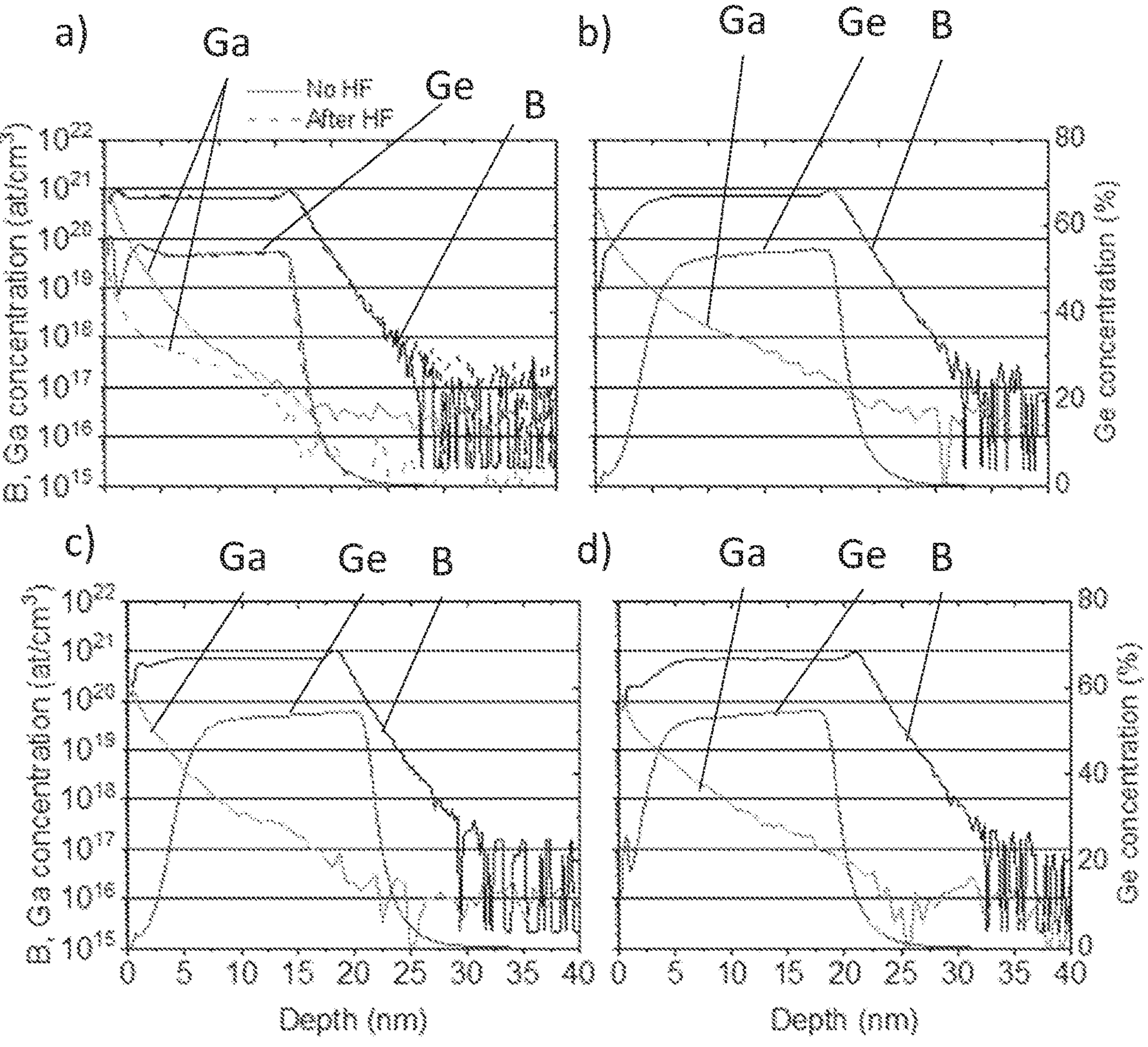
FIG. 9 shows secondary ion mass spectroscopy (SIMS) data that demonstrate the efficacy of exemplary embodiments of the disclosure.

FIG. 9 shows secondary ion mass spectroscopy (SIMS) data that demonstrate the efficacy of exemplary embodiments of the disclosure. In particular, panel a) shows SIMS data for two SiGe:B:Ga layer, without any cap, both without and with an HF dip. It is clear that an HF dip strongly reduces the gallium concentration in the SiGe:B:Ga layer. Panel b) shows SIMS data for a SiGe:B:Ga layer capped with 3 nm Si and exposed to an HF dip, panel c) shows SIMS data for a SiGe:B:Ga layer capped with 3 nm Si and exposed to an HF dip, and panel d) shows SIMS data for a SiGe:B:Ga layer capped with 5 nm Si and exposed to an HF dip. The SIMS data show that the cap layer can help to maintain the gallium concentration in the SiGe:B:Ga and/or at the interface between the cap layer and the SiGe:B:Ga layer, even after an HF dip.

Without the present invention being bound to a particular theory or mode of operation, it is believed that gallium segregates at the surface of boron- and gallium-doped silicon germanium layers. Also, it is believed that the capping layer effectively prevents or at least reduces gallium segregation at an exposed surface. When a thusly capped surface is then exposed to a chemical that preferentially etches gallium, the capping layer may prevent, or at least reduce, gallium removal from the SiGe:B:Ga layer. Exemplary chemicals which can preferentially remove gallium, and that the capping layer protects against, include aqueous HF and halogen-containing gasses such as HCl. Thus, a high surface concentration of p-type dopants such as Ga and B can be maintained. When a contact is then formed on the SiGe:B:Ga layer, a low contact resistance can be obtained. Note that even the presence of a few nanometers of cap layer on top of the SiGe:B:Ga layer does not have to be detrimental because of silicide formation on the one hand, and because the SIMS profiles show that any drop in boron concentration near the surface may be compensated for by an increase in gallium concentration near the surface. Thus, the present methods allow the formation of contacts having a very low contact resistance on p-type silicon germanium.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A system comprising:

one or more reaction chambers;

a gas injection system fluidly coupled to at least one of the one or more reaction chambers;

a first gas source;

a second gas source;

a third gas source;

an exhaust source; and a controller, wherein the controller is configured to control gas flow into the gas injection system to selectively form a p-type doped silicon germanium layer overlying a first surface of a substrate relative to a second surface of the substrate by performing the steps of:

depositing a p-type doped silicon germanium layer overlying the first surface and the second surface, the p-type doped silicon germanium layer comprising gallium;

depositing a cap layer overlying the p-type doped silicon germanium layer;

selectively etching the cap layer and the p-type doped silicon germanium layer overlying the second surface; and repeating the steps of depositing the p-type doped silicon germanium layer, depositing the cap layer, and selectively etching the cap layer and the p-type doped silicon germanium layer overlying the second surface to thereby selectively form the p-type doped silicon germanium layer overlying the first surface relative to the second surface.

2. The system of claim 1, wherein the controller is configured to perform the step of depositing the cap layer and the step of selectively etching the cap layer and the p-type doped silicon germanium layer overlying the second surface in a same reaction chamber of the one or more reaction chambers.

3. The system of claim 1, wherein the first gas source comprises a silicon precursor.

4. The system of claim 1, wherein the second gas source comprises a germanium precursor.

5. The system of claim 1, wherein the second gas source comprises a p-type dopant precursor and/or a gallium precursor.

6. The system of claim 1, further comprising an etchant gas source coupled to the one or more reaction chambers.

7. The system of claim 6, wherein the etchant gas source comprises a halide.

8. The system of claim 7, wherein the halide comprises one or more of hydrogen chloride and chlorine.

9. The system of claim 1, wherein the steps of depositing the p-type doped silicon germanium layer, depositing the cap layer and the selective etching are performed in the same reaction chamber; and, wherein the steps of depositing the p-type doped silicon germanium layer, depositing the cap layer, and the selective etching are repeated 1 to about 500 times.

10. The system of claim 1, wherein the p-type doped silicon germanium layer comprises boron.

11. The system of claim 1, wherein the step of depositing a p-type doped silicon germanium layer does not include exposing the first surface to a gas comprising a halide.

12. The system of claim 1, wherein the steps of depositing the p-type doped silicon germanium layer and depositing the cap layer are performed in the same reaction chamber.

13. The system of claim 1, wherein the first gas source comprises a precursor, and wherein the controller monitors a flowrate of the precursor.

14. The system of claim 1, wherein the controller controls a temperature within a reaction chamber of the one or more reaction chambers to a temperature between 350° C. to 600° C.

15. The system of claim 1, wherein the one or more reaction chambers comprise two or more reaction chambers coupled to the controller.

16. The system of claim 1, wherein the gas injection system is configured to meter and control gas flow of a gas from one or more of the first gas source, the second gas source, and the third gas source.

17. The system of claim 16, wherein the gas injection system is configured to meter and control gas flow of each gas from the first gas source, the second gas source, and the third gas source.

18. The system of claim 1, wherein the cap layer comprises silicon.

19. The system of claim 1, wherein the cap layer comprises p-type doped silicon.

20. The system of claim 1, wherein the cap layer is removed during the step of selectively etching the cap layer and the p-type doped silicon germanium layer overlying the second surface.

* * * * *